United States Patent [19]

Nakaya

[11] Patent Number: 5,771,009
[45] Date of Patent: Jun. 23, 1998

[54] METHOD AND APPARATUS FOR TRANSMITTING AND RECEIVING DATA

[75] Inventor: Yuichiro Nakaya, Tokyo, Japan

[73] Assignee: Hitachi, Ltd., Tokyo, Japan

[21] Appl. No.: 617,077

[22] Filed: Mar. 18, 1996

[30] Foreign Application Priority Data

Mar. 17, 1995 [JP] Japan .................................. 7-058494

[51] Int. Cl.[6] ................................................ H03M 7/30
[52] U.S. Cl. ........................... 341/50; 348/8; 395/200.14
[58] Field of Search ....................... 395/200.14, 200.15, 395/200.16, 200.17, 200.18, 327, 328, 566, 570, 831; 341/50; 348/8–12

[56] References Cited

U.S. PATENT DOCUMENTS

| 5,404,505 | 4/1995 | Levinson ................................ 395/600 |
| 5,440,632 | 8/1995 | Bacon et al. ............................. 380/20 |
| 5,485,221 | 1/1996 | Banker et al. .......................... 348/563 |
| 5,488,411 | 1/1996 | Lewis .......................................... 348/8 |
| 5,619,247 | 4/1997 | Russo ......................................... 348/3 |

Primary Examiner—Howard L. Williams
Attorney, Agent, or Firm—Antonelli, Terry, Stout & Kraus, LLP

[57] ABSTRACT

Software is transmitted for decoding a bit stream of coded data prior to transmitting the bit stream of coded data in order to shorten the time taken to start reproduction of the received bit stream of coded data on the reproducing side. The transmitted decoder software is compiled while a bit stream of data coded by a coding method known to the reproducing side is received on the reproducing side and reproduced thereby. Upon completion of compilation of the decoder software reproduction of the bit stream of data coded by the known coding method is switched to the reproduction of the bit stream of data coded by a coding method corresponding to the decoder software.

78 Claims, 4 Drawing Sheets

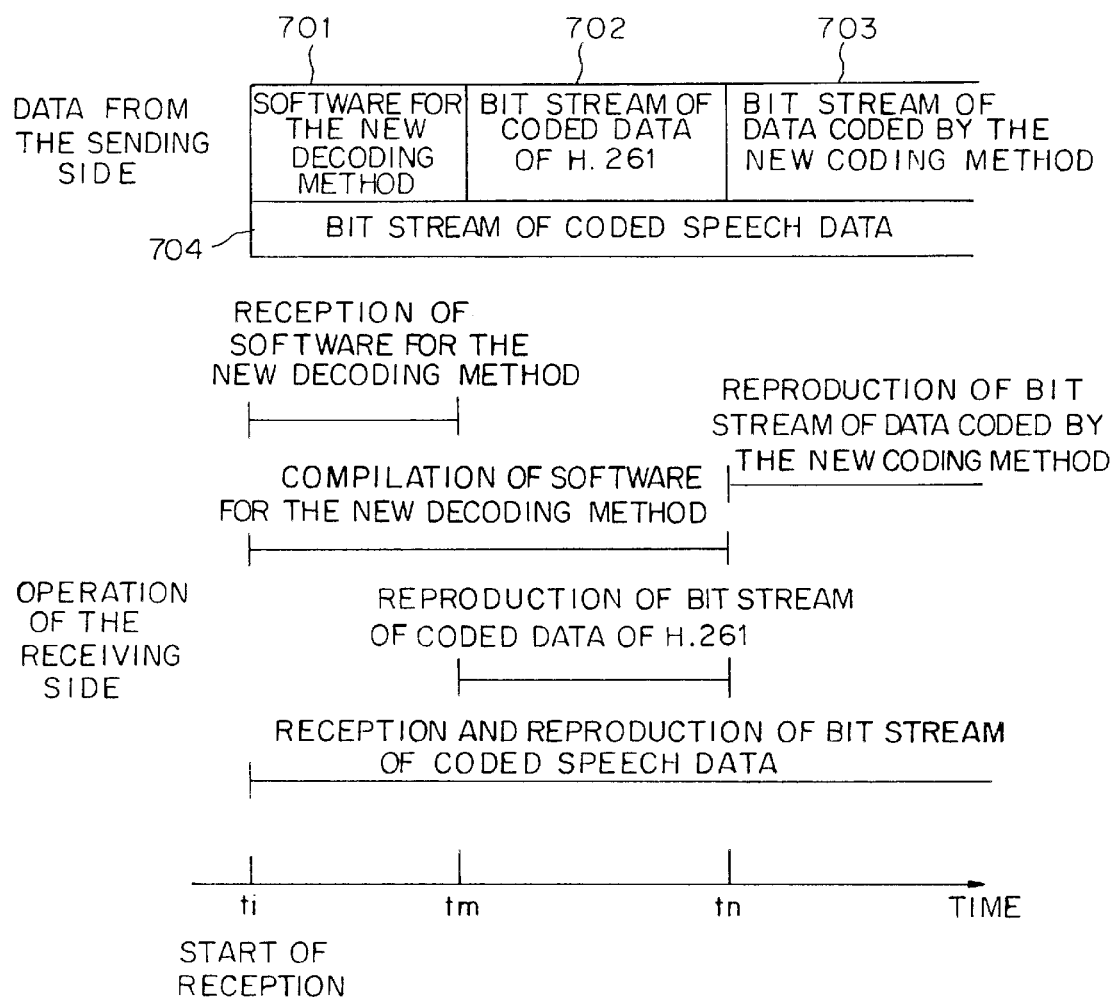

METHOD AND APPARATUS FOR TRANSMITTING AND RECEIVING DATA

BACKGROUND OF THE INVENTION

The present invention relates to a method and apparatus for transmitting or recording digital data. More particularly, the present invention relates to a method and apparatus for transmitting or receiving first coded data along with software for decoding second coded data, immediately decoding and reproducing the first coded data while compiling the software and thereafter decoding and reproducing the second coded data using the compiled software.

Due to recent progress in the electronic device technology, image data and speech data can be transmitted and stored in digital form. When image data and speech data is converted to digital form, the amount of data can be quite large. In many cases, therefore, the data is compressed (coded) relying upon data compression technology, and the data is transmitted or stored as a bit stream of coded data. To reproduce a bit stream of coded data, a decode processing must be executed on the reproducing side. In order to properly carry out the transmission, in this case, a common image coding system must be employed by both the coding side and the reproducing side. At present, standardized image coding systems such as H.261, MPEG 1, MPEG 2, etc. have been designated as international standards.

The coding and decoding processings are generally very complex and in many cases, modern devices use a dedicated chip for coding and decoding. In recent years, however, a coding/decoding technique (software codec) based upon software using a general purpose CPU has been proposed as a new implementation to substitute for the conventional image coding/decoding technique using a dedicated chip. The software codec requires a reduced amount of labor relative to the dedicated coding/decoding chip for developing devices. Further, the software code makes it possible to flexibly cope with changes in the functions and performance of the coding technique. Though a high-speed general purpose CPU is required to be used, the use of software codecs is expected to increase with an increase in the operation speed of general purpose CPUs.

FIGS. 1 and 2 illustrate the construction of a software image coder 100 which is provided in a sending side computer/apparatus and a software image decoder 200 which is provided in the reproducing (receiving) side computer/apparatus for coding and decoding a dynamic image, respectively. In the software image coder 100, the input image 101 is, first, stored in an input frame memory 102, and a general purpose CPU 103 reads the data therefrom and executes the code processing. The program for driving the general purpose CPU 103 is stored in a memory 104 for program storage. The general purpose CPU 103 executes the code processing by utilizing a processing memory 105. The coded data output by the general purpose CPU 103 are once stored in the output buffer 106 and then, output as a bit stream 107 of coded data.

In the software image decoder 200, the input bit stream 201 of coded data is once stored in an input buffer 202 and is then read by a general purpose CPU 203 which executes decode processing by utilizing a memory 204 such as ROM having stored therein a decoder program and a processing memory 205 such as RAM. As a result, the obtained decoded image is once stored in an output frame memory 206 and is then output as an output image 207.

As described above, the software codec 100 has a feature in that it is capable of flexibly coping with various coding techniques. Bearing in mind this feature, a method has been studied by a Standardization Group such as MPEG 4 and the like in an attempt to transmit a program for decoding the bit stream of coded data prior to transmitting the bit stream of coded data. FIG. 3 illustrates an example of this method. For easy explanation, it is presumed that the transmission delay in the transmission channel and the decoding delay are zero. In order to reproduce a bit stream 302 of coded data of which the transmission starts at a moment tb, a decoder software 301 is transmitted during a period from a moment ta before tb to the moment tb. In this case, the received decoder software is first compiled, and the reproduction of the data carried by the bit stream of coded data is started at time tc, that is, the moment the compilation is completed. Thus, the coding side is not strongly restrained by a standard coding method but, instead, it is allowed to select an optimum coding method depending upon the required functions (data compression ratio, error characteristics of the transmission channel, permissible decoding delay, etc.) thereby progressing along with improvements in image coding technology.

When software for decoding a bit stream of coded data is to be transmitted to the apparatus on the reproducing side prior to transmitting the bit stream of data coded by a coding/decoding method that is not provided on the reproducing side, a long time is required before the reproduction of received images is started on the reproducing side. That is, the viewer on the reproducing side is not displayed a reproduced image on the reproducing side while the decoder software is being received and compiled. The resulting delay in the start of reproduction and the display of a reproduced image can have a negative impact on the user.

When the transmission rate of the channel is limited, e.g. VOD (video on demand) systems using radio channels, it is difficult to shorten the time for receiving the software due to the limitations of the transmission process. Thus it is not possible to eliminate the above-described negative impact on the user.

SUMMARY OF THE INVENTION

The object of the present invention is to provide a method and apparatus for transmitting or receiving data in such a manner to make it possible to reproduce an image even when the data is to be reproduced by a coding/decoding system that is not provided on the reproducing side.

Another object of the present invention is to provide a method and apparatus for transmitting or receiving data to be reproduced in such a manner to shorten the waiting time before the transmitted data is reproduced, thereby reducing negative impact on the user.

Yet another object of the present invention is to provide a computer program executable by a computer for causing the computer to transmit or receive data in such a manner wherein first coded data transmitted with software for decoding by second coded data is immediately decoded and reproduced while compiling the software.

In order to accomplish the above-described objects according to the present invention, a first bit stream of data coded by a first coding/decoding method known to the reproducing or receiving apparatus, is sent by multiplex transmission together with software for decoding a second bit stream of data.

The first bit stream of data being received by the reproducing or receiving apparatus, according to the known first coding/decoding method, is reproduced while the software is compiled. Once the software has been complied, the second bit stream of data is reproduced and displayed according to a second coding/decoding method performed by the software when executed.

For example, when the first and second bit streams of data are image data, the reproducing or receiving apparatus has decoder software for decoding sub-image data sent thereto corresponding to the known first coding/decoding method. The sending apparatus also sends main image decoder software corresponding to the second coding/decoding method for decoding main image data at the head of first bit-stream of data that is sent. The sub-image data is sent with the main image decoder software by multiplex transmission. At the reproducing or receiving apparatus, the sub-image data is instantly reproduced and displayed on a display screen by using the known decoder software for decoding the sub-image data prior to reproducing and displaying the main image data. While the sub-image data is being reproduced and displayed the main image decoder software is complied. Upon completion of compilation of the main image decoder software, the main image is reproduced and displayed on the display screen according to the compiled main image decoder software. Thus, in the reproducing and receiving apparatus, the sub-image data can be offered to the user before the reception of the main image decoder software is completed and before the compilation of the main image decoder software has been completed.

The first bit stream of data can be extracted from data stored in a storage at the sending apparatus. The first bit stream of data can be either transmitted prior to transmission of the software or transmitted in a multiplexed manner with the software. The first and second bit stream of data can represent multimedia information (e.g., image, audio, speech, text, or multiple types of information being multiplexed).

To further accomplish the above-described objects according to the present invention a computer program is provided executable by a transmitting and reproducing computers and recorded on a computer readable medium. The computer program provides various code sections which cause the transmitting computer to transmit a first bit stream of data coded by a first coding/decoding method known to a reproducing computer along with software for decoding a second bit stream of data. The various code sections of the computer program also cause the reproducing computer receiving the first bit stream of data and the software to immediately reproduce the first bit stream of data while compiling the software. Upon completion of compilation of the software the various code sections of the computer program causes the reproducing computer to reproduce the second bit stream of data using the complied software.

BRIEF DESCRIPTION OF THE DRAWINGS

The present invention will be more apparent from the following detailed description, when taken in conjunction with the accompanying drawings, in which:

FIG. 7 is a diagram illustrating a system for transmitting a bit stream of coded speech data in a multiplexed manner at the time of transmitting a decoder software of the new method, a bit stream of coded data of H.261 and a bit stream of data coded by the new coding method.

DETAILED DESCRIPTION OF PREFERRED EMBODIMENTS

Described below is an example of a case where image data is transmitted. The coding method known on the receiving side is referred to as H.261 and the coding/decoding method unknown to the receiving side is referred to as a new method. Depending upon the cases, furthermore, the coding/decoding method is simply referred to as the coding method.

Figure 1:
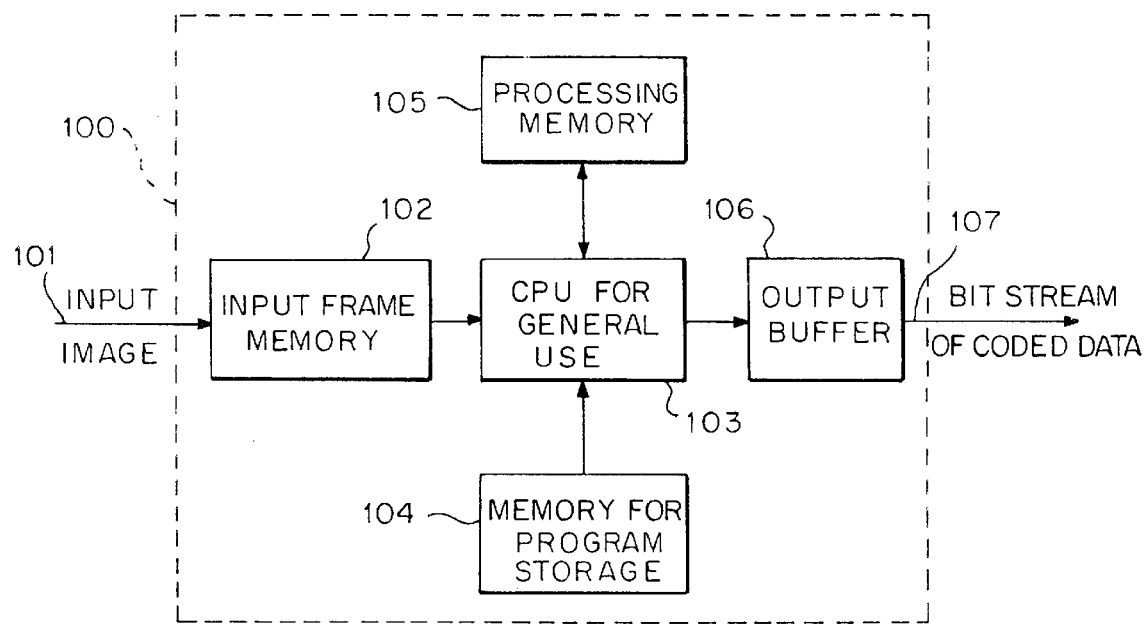
FIG. 1 is a diagram illustrating the constitution of a software image coder.
Figure 2:
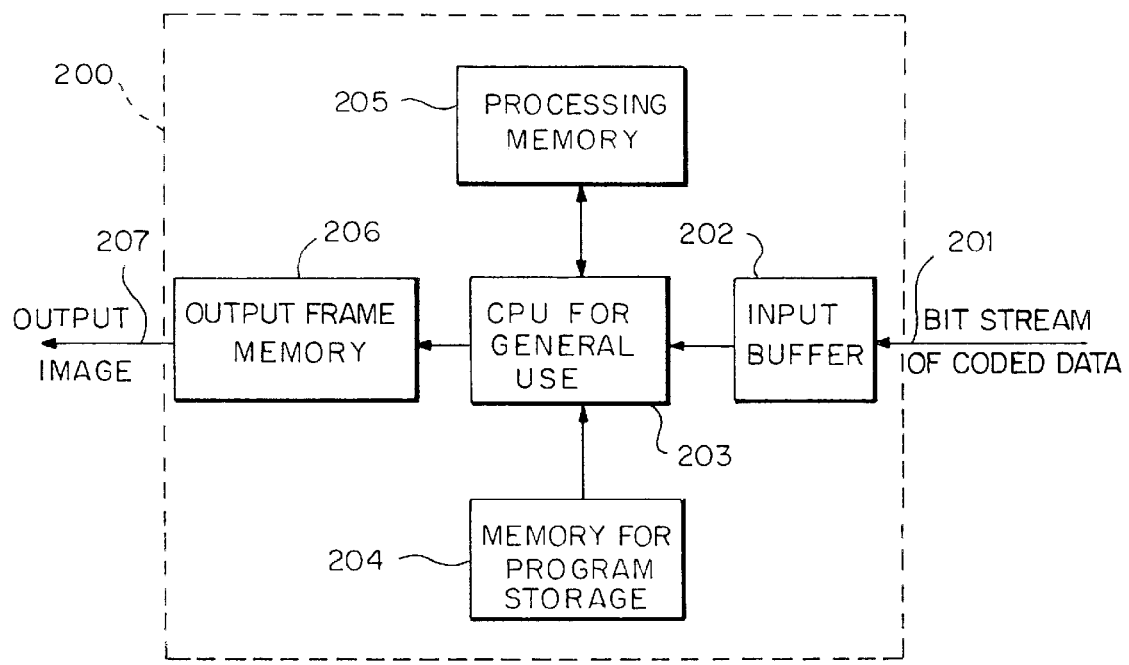
FIG. 2 is a diagram illustrating the constitution of a software image decoder.
Figure 3:
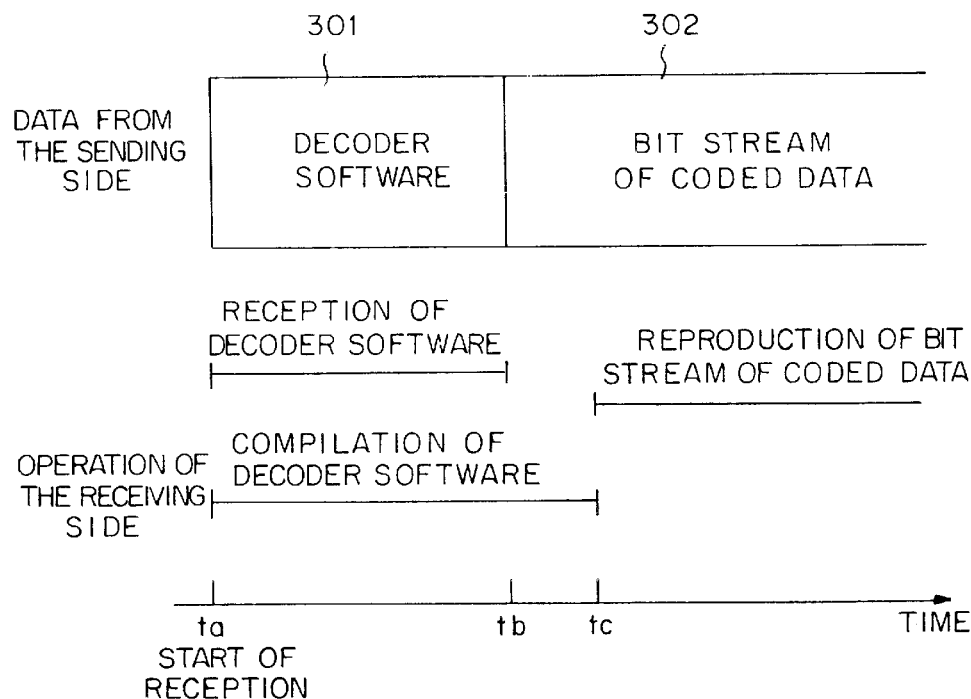
FIG. 3 is a diagram illustrating a system for transmitting a decoder software prior to transmitting a bit stream of coded data.
Figure 4:
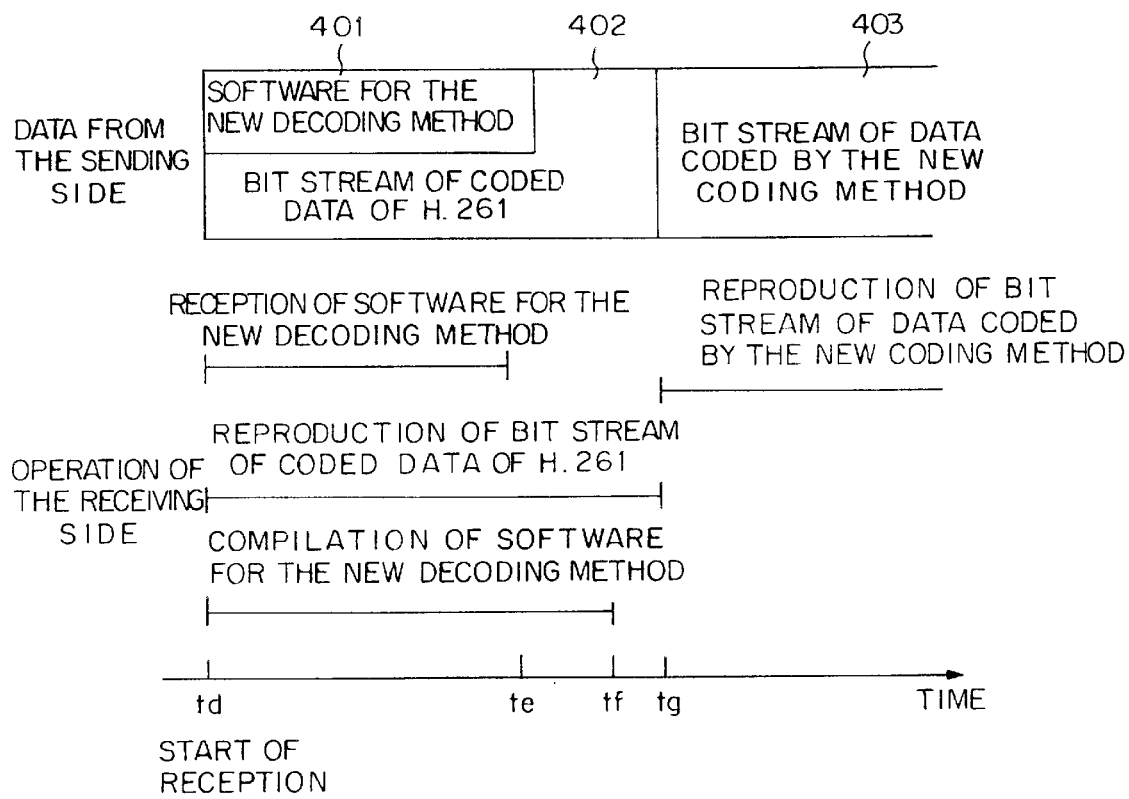
FIG. 4 is a diagram illustrating a system for transmitting a bit stream of coded data of H.261 being multiplexed with software that is transmitted for decoding a bit stream of data coded by a new coding method.

FIG. 4 illustrates a system for multiplex transmission of a bit stream of coded data of H.261 and decoder software of the new method, and a system for reproducing the data. For easy explanation, hereinafter, the transmission delay in the transmission channel and the decoding delay are presumed to be zero (0). Transmission is started at a moment td, and decoder software 401 and a bit stream 402 of coded data of H.261 are transmitted in a multiplexed manner. As the reception is started, the receiving side starts compiling the coder software and starts decoding the bit stream of coded data of H.261. Therefore, the terminal user is allowed to watch the reproduced image of H.261 within a short period of time after the start of reception and to obtain data quickly with reduced psychological burden or negative impact since he does not have to wait.

Transmission of the decoder software ends at a moment te, but the compilation of the received decoder software is still continuing. The moment when the compilation of the decoder software ends, the sending side changes the coding method for the bit stream of coded data sent at a moment tg from H.261 over to the new method. When the compilation has been finished before tg on the receiving side (FIG. 4 illustrates a case where the compilation is finished at a moment tf before the moment tg), the receiving side actuates the decoder software of the new decoding method from the moment tg to start reproducing the data coded by the new method. When the transmission channel has a fixed rate, the new method exhibits superior coding characteristics then the coding method H.261 and further utilizes the whole transmission capacity of the transmission channel. Therefore, the quality of the reproduced image is improved from a moment when the method of coding the reproduced bit stream of data is changed over to the new coding method.

To prevent the image quality from deteriorating before the moment tg, fine image or quickly moving image that can be coded with difficulty is not transmitted before the moment tg, but image such as still image or title that can be easily coded is transmitted. When the transmission channel has a variable rate, quality of the reproduced image can be maintained if the transmission rate is increased before the moment tg (particularly, before te) compared with that of after the moment tg, and the change in the quality of image caused by change-over of the coding method can be suppressed.

The above-described system can be realized even in a system having a storage unit (not shown) in which the data to be reproduced are recorded and are then read out. When the read data can be selected on the reproducing side from the storage unit, the timing for changing over the bit stream can be determined on the reproducing side. If the bit stream of coded data of H.261 is recorded at a slightly longer length, the reproducing side is allowed to discontinue the reproduction of bit stream of coded data of H.261 at a moment when the compilation of the decoder software for the new decoding method is completed on and to change the bit stream to be read out from H.261 to the new method.

In the system of FIG. 4, the reproduction of an image based on the bit stream of coded data of H.261 is interrupted when compilation of the decoder software has not been completed before the moment $t_g$. Attention therefore must be given on the sending side so that the coding method is not changed over at a too early timing. If the timing is too slow, there occurs a problem in that a moment for improving the quality of the reproduced image is delayed (in the case of the fixed rate).

Figure 5:
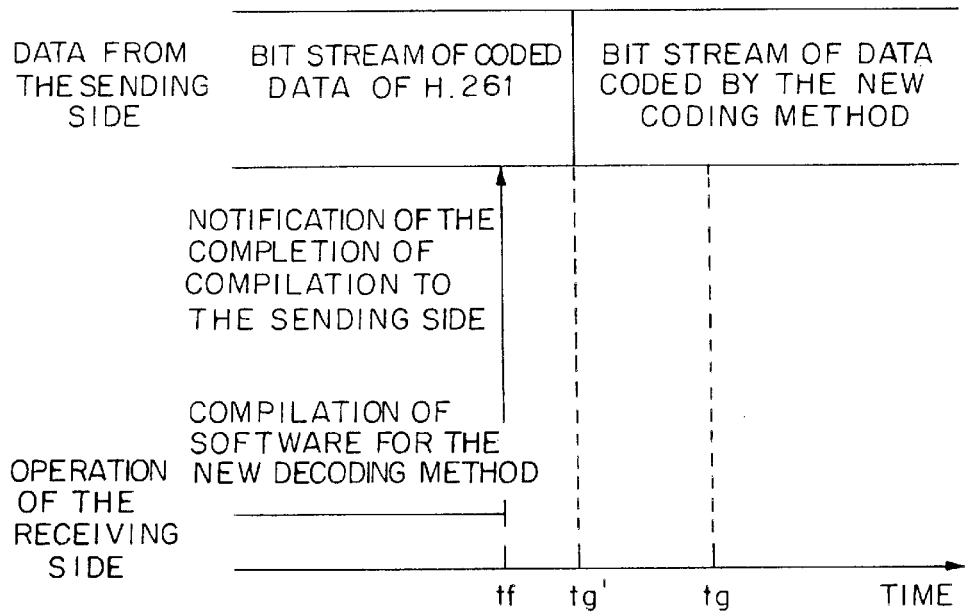
FIG. 5 is a diagram illustrating a system for changing over the bit stream of coded data at an optimum timing by notifying the transmitter of the completion of compilation of the decoder software of the new method.

The above-described problem can be solved by a system according to which the reproducing side notifies a moment at which the compilation of the decoder software ends (or a moment just before the end) to the sending side in a bidirectional transmission connection. This is shown in FIG. 5 wherein symbols are provided representing the moments corresponding to those of FIG. 4. When the compilation of the decoder software on the reproducing side ends at a moment tf, the reproducing side notifies this fact to the sending side in response to a sign 501. Upon receipt of this, the sending side changes the data to be sent from the bit stream 502 of coded data of H.261 over to a bit stream 503 of data coded by the new coding method at a first frame-dividing point tg' after tf.

The bit stream is changed over at the frame-dividing point tg' due to the fact that the coding method can be easily changed over by the coder at this timing. This makes it possible to solve the above-mentioned problem and to optimize the timing for changing over the coding method on the sending side.

Figure 6:
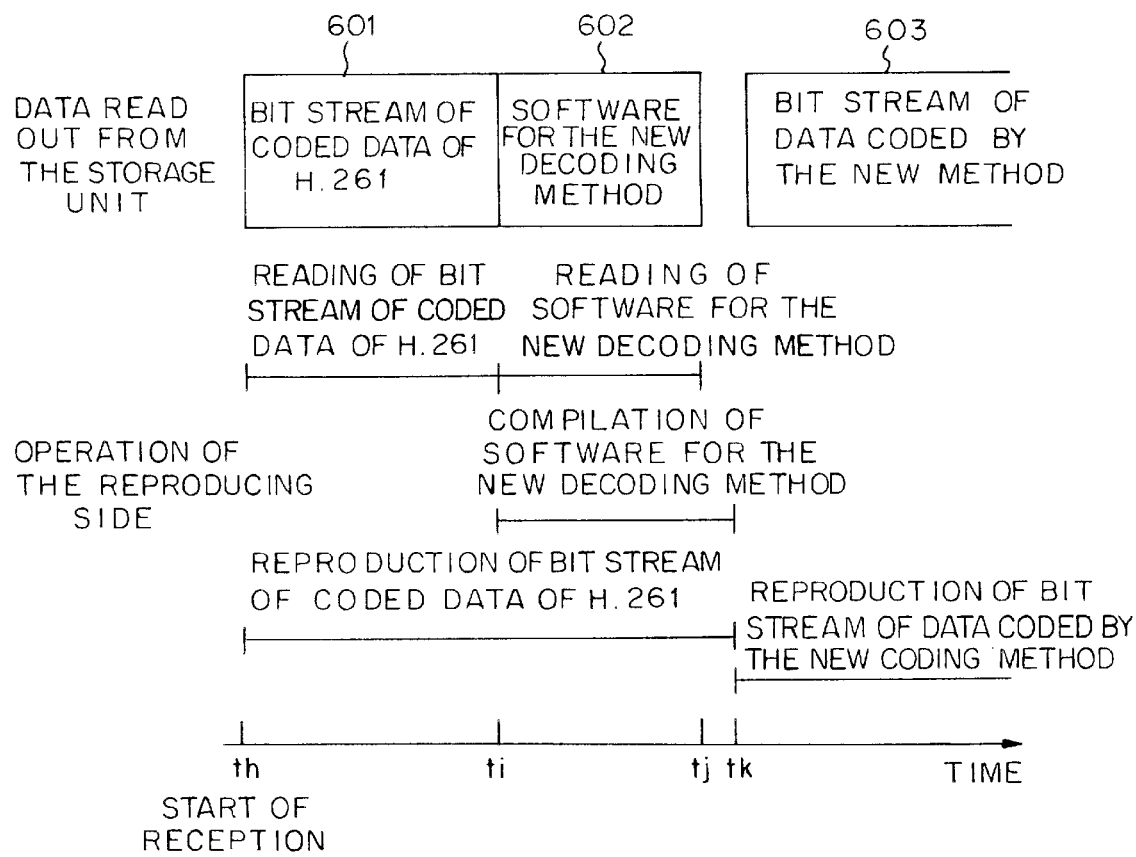
FIG. 6 is a diagram illustrating a system for transmitting a bit stream of coded data of H.261 prior to transmitting a software for decoding a bit stream of data coded by the new coding method.

FIG. 6 illustrates a system for realizing the function which resembles the system shown in FIG. 4 by using a storage units for storing data to be reproduced. It is presumed that the storage unit stores a bit stream of coded data of H.261 which is read during the period from tk to th, a bit stream of data coded by the new coding method, and decoder software for the new decoding method. At a moment th, a bit stream 601 of coded data of H.261 is read out of the storage unit and is reproduced. The bit stream of coded data of H.261 is read out up to a moment ti and during this period, an amount of data corresponding to the length of a period tk–th (>ti–th) is read out and is stored in the buffer in the reproducing apparatus.

The reproducing apparatus reproduces the data read out over a period of ti–th using a period of tk–th. A decoder software 602 of the new method is read out and is compiled at the moment ti at which reading of the bit stream of coded data of H.261 ends. Even during this period, reproduction of the bit stream of coded data of H.261 stored in the buffer is continuing. The reading and compilation of the decoder software terminates at moments tj and tk, respectively. The decoder software of the new method is activated at the moment tk, and the reading and reproduction of a bit stream 603 of coded data based on a new method are started.

The above-described system is simpler than the system of FIG. 4 since a plurality of bit streams are not simultaneously read out but is disadvantageous in that the decoder software cannot be compiled before the moment ti at which reception of the decoder software starts. Furthermore, when the bit stream of coded data of H.261 is read out, the data read out over a period of ti–th are reproduced using a period of tk–th. Attention therefore must be given to the fact that the image quality deteriorates unless the reading speed is increased.

The above-described problem concerning deterioration can be solved by a system according to which there is provided a bit stream of coded data of H.261 of only a short period of time, and this bit stream is repetitively reproduced prior to reading a bit stream of data coded by the new coding method. The user watches the same image repetitively before the bit stream of data coded by the new coding method is read out. However, since the image contains the data of only a short period of time, the image of H.261 can be reproduced maintaining good quality at the same reading speed as that of the case of FIG. 5.

In the case of FIG. 5, the bit stream of data coded by the new coding method is not read out until the reproduction of the bit stream of coded data of H.261 is completed. However, it is also allowable to interrupt the reproduction of the bit stream of coded data of H.261 at a moment when the compilation is completed and to readily start the reproduction of the bit stream of data coded by the new coding method. The same holds even when the bit stream of coded data of H.261 is repetitively reproduced.

The foregoing described the embodiment of FIG. 6 with reference to a storage system. The same system can be adapted as a transmission system, as well.

In the foregoing was described the case where the image data was transmitted. The invention can be further applied to the case of data (e.g., audio) other than image and to the case of a plurality of data (e.g., image and audio). When a plurality of data are to be simultaneously transmitted, limitation is imposed on the amount of data that can be transmitted in a multiplexed manner while the software is being transmitted. In such a case, part of the data may not be transmitted. Excluding image data is effective in such case, since the amount of image data is usually larger than that of other types of data.

When, for example, speech (or audio) and image are to be simultaneously transmitted as illustrated in FIG. 7, a bit stream 704 of coded speech (or audio) data and decoder software 701 for the new decoding method are transmitted in a multiplexed manner during the period from a moment ti to a moment tm. The bit stream of coded speech data and a bit stream 702 of coded data of H.261 are transmitted in a multiplexed manner during the period from the moment tm to a moment tn. The bit stream of coded speech data and a bit stream 703 of data coded by the new coding method are transmitted in a multiplexed manner after the moment tn (in this case, the speech coding system has been known on the receiving side). This makes it possible to maintain a transmission capacity large enough for transmitting speech data of sufficiently high quality without transmitting image of poor quality before the moment tm. The same system can also be adapted to a system having a storage unit as described above.

The above-described systems of the present invention illustrated in FIGS. 4–7 can be implemented by computer programs stored on a computer readable medium and executable by sending side and reproducing side computers. The computer programs of the preset invention can be a single computer program having code sections for operating the sending and reproducing side computers or individual computer programs each having code sections for operating either the sending side computer or the reproducing side computer. The computer programs of the present invention cause the sending side and reproducing side computers to perform the same operations described above relative to the systems of the present invention illustrated in FIGS. 4–7.

The present invention makes it possible to reproduce the received data even while the decoder software is being received and compiled, to shorten the time taken before images are reproduced from the received data, and to reduce psychological burden or negative impact on the user.

While the main image is being decoded, other image is displayed on the screen liberating the user from feeling uneasy about whether the system is operating properly. The system is allowed to effectively utilize the time in which the image usually cannot be displayed, making it possible to display, for example, image advertisement, timely information specific to main image, etc.

While the present invention has been described in detail and pictorially in the accompanying drawings it is not limited to such details since many changes and modifications recognizable to those of ordinary skill in the art may be made to the invention without departing from the spirit and the scope thereof.

I claim:

1. A method of transmitting data to a terminal connected to a network, said terminal being equipped with a first decoding algorithm, said method comprising the steps of:

transmitting a first bit stream of coded data corresponding to said first decoding algorithm along with software representing a second decoding algorithm to the terminal; and thereafter transmitting a second bit stream of data coded by a coding method corresponding to said second decoding algorithm to the terminal.

2. A method of transmitting data according to claim 1, wherein said first and/or second bit stream of coded data transmitted to said terminal corresponds to data stored in a storage.

3. A method of transmitting data according to claim 2, wherein said first bit stream of coded data is transmitted prior to transmitting said software.

4. A method of transmitting data according to claim 2, wherein said first bit stream of coded data and said software are transmitted in a multiplexed manner.

5. A method of transmitting data according to claim 2, wherein said first and second bit streams of coded data include image data.

6. A method of transmitting data according to claim 2, wherein said first bit stream of coded data does not include image data, and said second bit stream of coded data includes image data.

7. A method of transmitting data according to claim 1, wherein said first bit stream of coded data is transmitted prior to transmitting said software.

8. A method of transmitting data according to claim 1, wherein said first bit stream of coded data and said software are transmitted in a multiplexed manner.

9. A method of transmitting data according to claim 1, wherein said first and second bit streams of coded data include image data.

10. A method of transmitting data according to claim 1, wherein said first bit stream of coded data does not include image data, and said second bit stream of coded data includes image data.

11. A method of receiving data in a terminal connected to a network, said terminal being equipped with a first decoding algorithm, said method comprising the steps of:

receiving a first bit stream of coded data corresponding to the first decoding algorithm along with software representing a second decoding algorithm;

thereafter, receiving a second bit stream of data coded by a coding method corresponding to said second decoding algorithm; and reproducing said first bit stream of coded data based on the first decoding algorithm simultaneously with compilation of said software.

12. A method of receiving data according to claim 11, further comprising the step of:

reproducing said second bit stream of coded data based on said second decoding algorithm after the compilation of said software has been completed.

13. A method of receiving data according to claim 11, further comprising the step of:

repetitively reproducing said first bit stream of coded data based on the first decoding algorithm prior to commencing reproduction of said second bit stream of coded data.

14. A method of receiving data according to claim 11, further comprising the step of:

reproducing said second bit stream of coded data based on said second decoding algorithm in parallel with subsequent reception and reproduction of said first bit stream of coded data.

15. A method of receiving data according to claim 11, wherein said first and second bit streams of coded data include image data.

16. A method of receiving data according to claim 11, wherein said first bit stream of coded data does not include image data, and said second bit stream of coded data includes image data.

17. An apparatus for transmitting coded data to a terminal connected to a network, said terminal being equipped with a first decoding algorithm, said apparatus comprising:

means for transmitting a first bit stream of coded data corresponding to said first decoding algorithm along with software representing a second decoding algorithm to the terminal; and means for transmitting a second bit stream of data coded by a coding method corresponding to said second decoding algorithm to the terminal after transmission of said first bit stream of coded data.

18. An apparatus for transmitting coded data according to claim 17, wherein said first and/or second bit stream of coded data transmitted to said terminal corresponds to data stored in a storage.

19. An apparatus for transmitting coded data according to claim 18, wherein said first bit stream of coded data is transmitted prior to transmitting said software.

20. An apparatus for transmitting coded data according to claim 18, wherein said first bit stream of coded data and said software are transmitted in a multiplexed manner.

21. An apparatus for transmitting coded data according to claim 18, wherein said first and second bit streams of coded data include image data.

22. An apparatus for transmitting coded data according to claim 18, wherein said first bit stream of coded data does not include image data, and said second bit stream of coded data includes image data.

23. An apparatus for transmitting coded data according to claim 17, wherein said first bit stream of coded data is transmitted prior to transmitting said software.

24. An apparatus for transmitting coded data according to claim 17, wherein said first bit stream of coded data and said software are transmitted in a multiplexed manner.

25. An apparatus for transmitting coded data according to claim 17, wherein said first and second bit streams of coded data include image data.

26. An apparatus for transmitting coded data according to claim 17, wherein said first bit stream of coded data does not include image data, and said second bit stream of coded data includes image data.

27. An apparatus for receiving coded data in a terminal connected to a network, said terminal being equipped with a first decoding algorithm, said apparatus comprising:

means for receiving a first bit stream of coded data corresponding to the first decoding algorithm along with software representing a second decoding algorithm;

means for receiving a second bit stream of data coded by a coding method corresponding to said second decoding algorithm after receipt of said first bit stream of coded data; and means for reproducing said first bit stream of coded data based on the first decoding algorithm simultaneously with compilation of said software.

28. An apparatus for receiving coded data according to claim 27, further comprising:

means for reproducing said second bit stream of coded data based on said second decoding algorithm after the compilation of said software has been completed.

29. An apparatus for receiving coded data according to claim 27, further comprising:

means for repetitively reproducing said first bit stream of coded data based on the first decoding algorithm prior to commencing reproduction of said second bit stream of coded data.

30. An apparatus for receiving coded data according to claim 27, further comprising:

means for reproducing said second bit stream of coded data based on said second decoding algorithm in parallel with subsequent reception and reproduction of said first bit stream of coded data.

31. An apparatus for receiving coded data according to claim 27, wherein said first and second bit streams of coded data include image data.

32. An apparatus for receiving coded data according to claim 27, wherein said first bit stream of coded data does not include image data, and said second bit stream of coded data includes image data.

33. A system for transmitting coded data from a transmitter to a terminal connected to a network and receiving said coded data in said terminal, said terminal being equipped with a first decoding algorithm, said system comprising:

said transmitter which comprises:
means for transmitting a first bit stream of coded data corresponding to the first decoding algorithm along with software representing a second decoding algorithm to the terminal, and means for transmitting a second bit stream of data coded by a coding method corresponding to said second decoding algorithm to the terminal after transmission of said first bit stream of coded data; and said terminal which comprises:
means for receiving said first bit stream of coded data corresponding to the first decoding algorithm along with said software representing said second decoding algorithm, means for receiving said second bit stream of data coded by said coding method corresponding to said second decoding algorithm after receipt of said first bit stream of coded data, means for reproducing said first bit stream of coded data based on the first decoding algorithm simultaneously with compilation of said software, and means for notifying said transmitter when compilation of said software has been completed.

34. A system according to claim 33, wherein said first bit stream of coded data transmitted to said terminal corresponds to data stored in a storage.

35. A system according to claim 34, wherein said first bit stream of coded data and said software are transmitted in a multiplexed manner.

36. A system according to claim 34, wherein said first and second bit streams of coded data include image data.

37. A system according to claim 34, wherein said first bit stream of coded data does not include image data, and said second bit stream of coded data includes image data.

38. A system according to claim 33, wherein said second bit stream of coded data transmitted to said terminal corresponds to data stored in a storage.

39. A system according to claim 33, wherein said first bit stream of coded data is transmitted prior to transmitting said software.

40. A system according to claim 34, wherein said first bit stream of coded data is transmitted prior to transmitting said software.

41. A system according to claim 33, wherein said first bit stream of coded data and said software are transmitted in a multiplexed manner.

42. A system according to claim 33, wherein said first and second bit streams of coded data include image data.

43. A system according to claim 33, wherein said first bit stream of coded data does not include image data, and said second bit stream of coded data includes image data.

44. A system according to claim 33, wherein said receiving apparatus further comprises:

means for reproducing said second bit stream of coded data based on said second decoding algorithm after the compilation of said software has been completed.

45. A system according to claim 33, wherein said receiving apparatus further comprises:

means for repetitively reproducing said first bit stream of coded data based on the first decoding algorithm prior to commencing reproduction of said second bit stream of coded data.

46. A system according to claim 33, wherein said receiving apparatus further comprises:

means for reproducing said second bit stream of coded data based on said second decoding algorithm in parallel with subsequent reception and reproduction of said first bit stream of coded data.

47. A method of outputting image data, wherein first software for decoding data coded by a first coding method is provided in a receiving terminal connected to a network, said method comprising the steps of:

receiving second software for decoding main image data coded by a second coding method and sub-image data coded by said first coding method prior to receiving said main image data from said network;

outputting said sub-image data decoded using said first software to a display screen in parallel with compilation of said second software; and outputting said main image data decoded using said second software to said display screen after compilation of said second software.

48. A computer program executable by a computer for transmitting data to a terminal connected to a network, said terminal being equipped with a first decoding algorithm, comprising:
   a computer readable medium with said computer program recorded thereon, said computer program comprises:
     a first code section for causing said computer to perform a function of transmitting a first bit stream of coded data corresponding to said first decoding algorithm along with software representing a second decoding algorithm to the terminal; and
     a second code section for causing said computer to perform a function of thereafter transmitting a second bit stream of data coded by a coding method corresponding to said second decoding algorithm to the terminal.

49. A computer program according to claim 48, wherein said first and/or second bit stream of coded data transmitted to said terminal corresponds to data stored in a storage.

50. A computer program according to claim 49, wherein said first bit stream of coded data is transmitted prior to transmitting said software.

51. A computer program according to claim 49, wherein said first bit stream of coded data and said software are transmitted in a multiplexed manner.

52. A computer program according to claim 49, wherein said first and second bit streams of coded data include image data.

53. A computer program according to claim 49, wherein said first bit stream of coded data does not include image data, and said second bit stream of coded data includes image data.

54. A computer program according to claim 48, wherein said first bit stream of coded data is transmitted prior to transmitting said software.

55. A computer program according to claim 48, wherein said first bit stream of coded data and said software are transmitted in a multiplexed manner.

56. A computer program according to claim 48, wherein said first and second bit streams of coded data include image data.

57. A computer program according to claim 48, wherein said first bit stream of coded data does not include image data, and said second bit stream of coded data includes image data.

58. A computer program executable by a computer for receiving data, said computer being connected to a network, and being equipped with a first decoding algorithm, comprising:
   a computer readable medium with said computer program recorded thereon, said computer program comprises:
     a first code section for causing said computer to perform a function of receiving a first bit stream of coded data corresponding to the first decoding algorithm along with software representing a second decoding algorithm;
     a second code section for causing said computer to perform a function of thereafter, receiving a second bit stream of data coded by a coding method corresponding to said second decoding algorithm; and
     a third code section for causing said computer to perform a function of reproducing said first bit stream of coded data based on the first decoding algorithm simultaneously with compilation of said software.

59. A computer program according to claim 58, further comprising:
   a fourth code section for causing said computer to perform a function of reproducing said second bit stream of coded data based on said second decoding algorithm after the compilation of said software has been completed.

60. A computer program according to claim 58, further comprising:
   a fourth code section for causing said computer to perform a function of repetitively reproducing said first bit stream of coded data based on the first decoding algorithm prior to commencing reproduction of said second bit stream of coded data.

61. A computer program according to claim 58, further comprising:
   a fourth code section for causing said computer to perform a function of reproducing said second bit stream of coded data based on said second decoding algorithm in parallel with subsequent reception and reproduction of said first bit stream of coded data.

62. A computer program according to claim 58, wherein said first and second bit streams of coded data include image data.

63. A computer program according to claim 58, wherein said first bit stream of coded data does not include image data, and said second bit stream of coded data includes image data.

64. A computer program executable by a computer for outputting image data, wherein first software for decoding data coded by a first coding method is provided in said computer which is connected to a network, comprising:
   a computer readable medium with said computer program recorded thereon, said computer program comprises:
     a first code section for causing said computer to perform a function of receiving second software for decoding main image data coded by a second coding method and sub-image data coded by said first coding method prior to receiving said main image data from said network;
     a second code section for causing said computer to perform a function of outputting said sub-image data decoded using said first software to a display screen in parallel with compilation of said second software; and
     a third code section for causing said computer to perform a function of outputting said main image data decoded using said second software to said display screen after compilation of said second software.

65. A computer program executable by a transmitting computer for transmitting coded data to a reproducing computer which receives said coded data, said transmitting and reproducing computers being connected to a network and said reproducing computer is equipped with a first decoding algorithm, comprising:
   a computer readable medium with said computer program recorded thereon, said computer program comprises:
     a first code section for causing said transmitting computer to perform a function of transmitting a first bit stream of coded data corresponding to the first decoding algorithm along with software representing a second decoding algorithm to said reproducing computer;
     a second code section for causing said transmitting computer to perform a function of transmitting a second bit stream of data coded by a coding method corresponding to said second decoding algorithm to said reproducing computer after transmission of said first bit stream of coded data;

a third code section for causing said reproducing computer to perform a function of receiving said first bit stream of coded data corresponding to the first decoding algorithm along with said software representing said second decoding algorithm;

a fourth code section for causing said reproducing computer to perform a function of receiving said second bit stream of data coded by said coding method corresponding to said second decoding algorithm after receipt of said first bit stream of coded data;

a fifth code section for causing said reproducing computer to perform a function of reproducing said first bit computer to perform a function of reproducing said first bit stream of coded data based on the first decoding algorithm simultaneously with compilation of said software; and a sixth code section for causing said reproducing computer to perform a function on notifying said transmitting computer when compilation of said software has been completed.

66. A computer program according to claim 65, wherein said first bit stream of coded data transmitted to said reproducing computer corresponds to data stored in a storage.

67. A computer program according to claim 66, wherein said first bit stream of coded data is transmitted prior to transmitting said software.

68. A computer program according to claim 66, wherein said first bit stream of coded data and said software are transmitted in a multiplexed manner.

69. A computer program according to claim 66, wherein said first and second bit streams of coded data include image data.

70. A computer program according to claim 66, wherein said first bit stream of coded data does not include image data, and said second bit stream of coded data includes image data.

71. A computer program according to claim 65, wherein said second bit stream of coded data transmitted to said reproducing computer corresponds to data stored in a storage.

72. A computer program according to claim 65, wherein said first bit stream of coded data is transmitted prior to transmitting said software.

73. A computer program according to claim 65, wherein said first bit stream of coded data and said software are transmitted in a multiplexed manner.

74. A computer program according to claim 65, wherein said first and second bit streams of coded data include image data.

75. A computer program according to claim 65, wherein said first bit stream of coded data does not include image data, and said second bit stream of coded data includes image data.

76. A computer program according to claim 65, further comprising:

a seventh code section for causing said reproducing computer to perform a function of reproducing said second bit stream of coded data based on said second decoding algorithm after the compilation of said software has been completed.

77. A computer program according to claim 65, further comprising:

a seventh code section for causing said reproducing computer to perform a function of repetitively reproducing said first bit stream of coded data based on the first decoding algorithm prior to commencing reproduction of said second bit stream of coded data.

78. A computer program according to claim 65, further comprising:

a seventh code section for causing said reproducing computer to perform a function of reproducing said second bit stream of coded data based on said second decoding algorithm in parallel with subsequent reception and reproduction of said first bit stream of coded data.

* * * * *